United States Patent
Feichtinger et al.

(10) Patent No.: US 9,449,958 B2
(45) Date of Patent: Sep. 20, 2016

(54) LIGHT-EMITTING DIODE DEVICE

(71) Applicant: EPCOS AG, Munich (DE)

(72) Inventors: Thomas Feichtinger, Graz (AT); Oliver Dernovsek, Lieboch (AT); Klaus-Dieter Aichholzer, Deutschlandsberg (AT); Sebastian Brunner, Graz (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/403,143

(22) PCT Filed: Apr. 17, 2013

(86) PCT No.: PCT/EP2013/058009
§ 371 (c)(1),
(2) Date: Nov. 21, 2014

(87) PCT Pub. No.: WO2013/174583
PCT Pub. Date: Nov. 28, 2013

(65) Prior Publication Data
US 2015/0144983 A1 May 28, 2015

(30) Foreign Application Priority Data
May 24, 2012 (DE) .......... 10 2012 104 494

(51) Int. Cl.
*H01L 33/00* (2010.01)
*H01L 27/02* (2006.01)
(Continued)

(52) U.S. Cl.
CPC ......... *H01L 27/0248* (2013.01); *H01L 25/167* (2013.01); *H01L 33/48* (2013.01); *H01L 33/486* (2013.01); *H01L 33/62* (2013.01); *H01L 33/642* (2013.01); *H01L 33/647* (2013.01); *H01L 2924/0002* (2013.01)

(58) Field of Classification Search
CPC .................. H01L 2924/00; H01L 2924/0002; H01L 2224/48091; H01L 2924/00014; H01L 27/0255; H01L 25/167; H01L 23/60; H01L 2924/10253; H01L 2924/3025; H01L 2924/12032; H01L 2224/45147; H01L 29/861
USPC ............ 257/88, 99, E33.066; 438/26, 24, 33
See application file for complete search history.

(56) References Cited

U.S. PATENT DOCUMENTS 8,378,455 B2    2/2013   Feichtinger et al.
2004/0222433 A1* 11/2004   Mazzochette ....... H01L 25/0753
                                                                                        257/99
(Continued)

FOREIGN PATENT DOCUMENTS

DE    102008024480 A1    12/2009
DE    102010001791 A1    9/2010
(Continued)

*Primary Examiner* — Kimberly Rizkallah
*Assistant Examiner* — Maria Ligai
(74) *Attorney, Agent, or Firm* — Slater Matsil, LLP

(57) ABSTRACT

A light-emitting diode device includes a carrier having at least one cavity, a light-emitting diode chip is arranged in a manner at least partly recessed in the at least one cavity, and an ESD protection element, which is formed by a partial region of the carrier. Furthermore, a light-emitting diode device includes a carrier having at least one cavity, a light-emitting diode chip arranged on the carrier, and an electrical component arranged at least partly recessed in the at least one cavity. Furthermore, the light-emitting diode device includes an ESD protection element, which is formed by a partial region of the carrier.

14 Claims, 3 Drawing Sheets

(51) Int. Cl.
*H01L 25/16* (2006.01)
*H01L 33/48* (2010.01)
*H01L 33/62* (2010.01)
*H01L 33/64* (2010.01)

(56) References Cited

U.S. PATENT DOCUMENTS

| | | | |
|---|---|---|---|
| 2005/0104220 A1 | 5/2005 | Tsuchiya et al. | |
| 2005/0184387 A1* | 8/2005 | Collins | H01C 7/112 257/712 |
| 2007/0018191 A1 | 1/2007 | Roh et al. | |
| 2007/0200133 A1 | 8/2007 | Hashimoto et al. | |
| 2007/0290329 A1 | 12/2007 | Murayama et al. | |
| 2008/0012125 A1 | 1/2008 | Son | |
| 2008/0083929 A1 | 4/2008 | Fan et al. | |
| 2008/0225449 A1 | 9/2008 | Inoue et al. | |
| 2008/0238604 A1 | 10/2008 | Sato et al. | |
| 2008/0290353 A1* | 11/2008 | Medendorp, Jr. | H01L 25/167 257/89 |
| 2009/0027157 A1 | 1/2009 | Katsumura et al. | |
| 2010/0078668 A1 | 4/2010 | Kim | |
| 2010/0219733 A1 | 9/2010 | Wan et al. | |
| 2011/0261536 A1* | 10/2011 | Feichtinger et al. | 361/713 |
| 2012/0223416 A1* | 9/2012 | Scheubeck et al. | 257/603 |
| 2012/0300491 A1 | 11/2012 | Hussell et al. | |

FOREIGN PATENT DOCUMENTS

| | | |
|---|---|---|
| EP | 1531492 | 5/2005 |
| EP | 1868245 | 12/2007 |
| EP | 2224485 A2 | 9/2010 |
| JP | H11251644 | 9/1999 |
| JP | 2000261039 | 9/2000 |
| JP | 2005150386 | 6/2005 |
| JP | 2006339559 | 12/2006 |
| JP | 2007150229 A | 6/2007 |
| JP | 2008021987 | 1/2008 |
| JP | 2008022006 | 1/2008 |
| JP | 2008150386 | 7/2008 |
| JP | 2008270327 | 11/2008 |
| JP | 2009130237 | 6/2009 |
| JP | 2009206422 | 9/2009 |
| JP | 2010244973 | 10/2010 |
| WO | 2006010690 | 2/2006 |
| WO | 2006106717 A1 | 12/2006 |
| WO | 2007058438 A1 | 5/2007 |
| WO | 2009141266 A1 | 11/2009 |

* cited by examiner

LIGHT-EMITTING DIODE DEVICE

This patent application is a national phase filing under section 371 of PCT/EP2013/058009, filed Apr. 17, 2013, which claims the priority of German patent application 10 2012 104 494.5, filed May 24, 2012, each of which is incorporated herein by reference in its entirety.

TECHNICAL FIELD

A light-emitting diode device comprises a carrier having at least one cavity and also a light-emitting diode chip.

BACKGROUND

Light-emitting diodes ("LEDs") are known in which an LED chip and a protection component are arranged on a planar carrier. Light emitted by the LED chip can be shaded by the protection component.

SUMMARY OF THE INVENTION

At least some embodiments specify a light-emitting diode device.

A light-emitting diode device in accordance with at least one embodiment comprises a carrier. The carrier can comprise a main body. By way of example, the carrier can comprise a ceramic main body. Alternatively, it is also possible for the carrier to comprise a main body comprising an organic material. By way of example, the main body can comprise a printed circuit board comprising an organic material.

In accordance with a further embodiment, the main body comprises a semiconducting material. In accordance with one preferred embodiment, the main body comprises a ceramic varistor material. By way of example, the main body comprises $SrTiO_3$, ZnO—Pr or ZnO—Bi. Furthermore, it is possible for the main body to comprise a composite composed of ZnO—Pr and glass or a composite composed of ZnO—Pr and an organic material, or to consist of a composite composed of ZnO—Pr and glass or composed of ZnO—Pr and an organic material. Here and hereinafter, the term "composite" can in this case denote, in particular, a material formed by a composite assembly or a mixture composed of at least two different substances.

In accordance with a further embodiment, the main body comprises aluminum oxide, aluminum nitride or a ceramic of the type LTCC ("low temperature cofired ceramics") or consists of one of these materials.

In accordance with a further embodiment, the light-emitting diode device comprises a light-emitting diode chip. Preferably, the light-emitting diode chip comprises at least one of the following materials: gallium phosphide (GaP), gallium nitride (GaN), gallium arsenic phosphide (GaAsP), aluminum gallium indium phosphide (AlGaInP), aluminum gallium phosphide (AlGaP), aluminum gallium arsenide (AlGaAs), indium gallium nitride (InGaN), aluminum nitride (AlN), aluminum gallium nitride (AlGaN), aluminum gallium indium nitride (AlGaInN), zinc selenide (ZnSe).

In accordance with a further embodiment, the light-emitting diode chip has at least two contact areas. Preferably, the contact areas are solderable. By way of example, the contact areas comprise or consist of an alloy or a layer sequence comprising one of the following material combinations: Cu/Ni/Au, Cr/Ni/Au, Cr/Cu/Ni/Au, Cu/Ni/Sn, Cr/Ni/Sn, Cr/Cu/Ni/Sn.

In accordance with a further embodiment, the light-emitting diode device comprises an ESD protection element. Here and hereinafter, "ESD" in this case stands for "electrostatic discharge". Preferably, the ESD protection element is formed by a partial region of the carrier.

Particularly preferably, the ESD protection element can be a protection structure integrated into the carrier and/or into the main body. In other words, the ESD protection element is not mounted as a discrete component, for example, in the form of a discrete ESD protection diode, on the carrier. In this case, it may be that the ESD protection element comprises a material, for example, a ceramic varistor material, which the carrier and/or the main body also comprise(s). Alternatively, it is possible for the ESD protection element to comprise a material that differs from the material or the materials of the carrier and/or of the main body. By way of example, the ESD protection element can comprise a semiconducting material, for example, a ceramic varistor material, which is embedded into the carrier, which comprises, for example, aluminum oxide, aluminum nitride or an organic material.

In accordance with a further embodiment, the ESD protection element is embodied as a varistor. By way of example, the ESD protection element comprises varistor material or a composite composed of a varistor material and a metal.

In accordance with a further embodiment, the ESD protection element comprises a varistor ceramic and a plurality of overlapping internal electrodes. The internal electrodes are preferably contact-connected alternately, for example, by means of vias that are led, for example, from one or a plurality of surfaces of the carrier into the main body. The internal electrodes preferably comprise silver or silver-palladium. Alternatively, it is also conceivable for the ESD protection element to be formed by a semiconductor diode integrated into the carrier.

The ESD protection element preferably serves for protecting the light-emitting diode chip against overvoltages, in particular against electrostatic discharges. In general, light-emitting diode chips are very sensitive to electrostatic discharges, in particular in the case of those having a voltage value of greater than 100 volts, and must therefore be protected by protection components.

The fact that the ESD protection element is formed by a partial region of the carrier of the light-emitting diode device advantageously makes it possible to achieve a particularly compact design of a light-emitting diode device described here.

In accordance with a further embodiment, the light-emitting diode device comprises at least one electrical component. The electrical component is, for example, a discrete electrical component having no optoelectronic properties. That can mean, in particular, that the electrical component is neither a light-emitting nor a light-receiving electrical component. The electrical component can be interconnected with the light-emitting diode chip, in particular. Preferably, the electrical component is arranged on the carrier.

In accordance with a further embodiment, the electrical component has at least two contact areas. Preferably, the contact areas are solderable. By way of example, the contact areas comprise or consist of an alloy or a layer sequence comprising one of the following material combinations: Cu/Ni/Au, Cr/Ni/Au, Cr/Cu/Ni/Au, Cu/Ni/Sn, Cr/Ni/Sn, Cr/Cu/Ni/Sn.

In accordance with a further embodiment, the electrical component is an ultrathin protection component. That can mean, in particular, that the electrical component can have a structural height of less than or equal to 150 µm.

In accordance with a further embodiment, the electrical component has a surface-mountable termination. By way of example, the electrical component can be a surface-mounted component (SMD, "surface-mounted device"). The electrical component can furthermore have a BGA package form (BGA, "ball grid array") or an LGA package form (LGA, "land grid array").

In accordance with a further embodiment, the electrical component is a thermistor component. The thermistor component can be embodied as a so-called NTC thermistor component, for example, wherein "NTC" stands for "negative temperature coefficient". An NTC thermistor component is distinguished by the fact that current is conducted better at high temperatures than at low temperatures. Therefore the NTC thermistor component can also be designated as hot conductor in German.

Preferably, the NTC thermistor component functions as a thermal sensor. The thermal sensor is preferably interconnected with the light-emitting diode chip. By way of example, the thermal sensor can contribute to the regulation of a control current of the light-emitting diode chip, such that the latter can be operated with care. As a result, the lifetime of the light-emitting diode chip can advantageously be increased.

Furthermore, it is possible for the thermistor component to be embodied as a so-called PTC thermistor component, wherein "PTC" stands for "positive temperature coefficient". The PTC thermistor component is preferably interconnected with the light-emitting diode chip. In the case of a PTC thermistor component, current is conducted better at low temperatures than at high temperatures, for which reason the PTC thermistor component is also designated as cold conductor in German. Preferably, the PTC thermistor component functions as an overcurrent protection element and protects the light-emitting diode chip against excessively high operating currents, as a result of which the lifetime of the light-emitting diode chip can be increased.

In accordance with a further embodiment, the light-emitting diode device comprises at least one further electrical component. The further electrical component can be embodied like the electrical component described above. Furthermore, it is possible for the electrical components in each case to have one of the embodiments described above and to be different from one another. By way of example, the electrical component can be embodied as an NTC thermistor component and the further electrical component can be embodied as a PTC thermistor component.

In accordance with a further embodiment, the carrier has at least one cavity. The cavity is formed, for example, by a depression at a surface of the carrier and in particular of the main body. The cavity preferably has a mounting area, such that, by way of example, the light-emitting diode chip or the electrical component can be mounted in the cavity.

In accordance with a further embodiment, the light-emitting diode chip is arranged in a manner at least partly recessed in the cavity. By way of example, the light-emitting diode chip can be arranged in the cavity such that regions of the light-emitting diode chip can project beyond the cavity. In this case, it can be advantageous, in particular, if an active region of the light-emitting diode chip, in which light is generated during operation, is arranged below an upper edge of the cavity. As a result, by way of example, light generated by the light-emitting diode chip can be prevented from impinging directly on a component arranged on the carrier, and from being shaded as a result.

In accordance with one particularly preferred embodiment, the light-emitting diode device comprises a carrier having at least one cavity, a light-emitting diode chip, which is arranged in a manner at least partly recessed in the at least one cavity, and an ESD protection element, which is formed by a partial region of the carrier.

In accordance with a further preferred embodiment, the light-emitting diode chip is arranged in a manner completely recessed in the cavity. The fact that a component is arranged "in a manner completely recessed" in a cavity can mean here in particular that the cavity has a depth that is greater than or equal to a height of the component arranged in the cavity, such that no region of the component projects beyond the cavity.

In accordance with a further embodiment, the cavity in which the light-emitting diode chip is arranged has a base surface and side surfaces. The side surfaces preferably run obliquely with respect to the base surface. By way of example, the side surfaces each form an angle of between 120° and 150° with the base surface. In accordance with one preferred embodiment, the side surfaces each form an angle of between 130° and 140° with the base surface. Particularly preferably, the side surfaces each form an angle of 135° with the base surface.

In accordance with a further embodiment, the cavity in which the light-emitting diode chip is arranged has a reflective layer. By way of example, the side surfaces and/or the base surface of the cavity can be coated with the reflective layer.

By means of the side surfaces of the cavity that run obliquely with respect to the base surface, and by means of the reflective layer arranged on the side surfaces and/or the base surface, a particularly good yield of the light emitted by the light-emitting diode chip can be obtained since that part of the light which is emitted by the light-emitting diode chip during operation in the direction of the side walls and/or the base surface of the cavity can be reflected out of the cavity.

In accordance with a further embodiment, the light-emitting diode chip is arranged on the carrier without being recessed in a cavity. By way of example, the light-emitting diode chip can be applied on a surface of the carrier and/or of the main body.

In accordance with a further embodiment, the electrical component is arranged in a manner at least partly recessed in the cavity of the carrier. By way of example, the electrical component can be arranged in the cavity of the carrier, while the light-emitting diode chip is not arranged in a cavity. As an alternative thereto, the light-emitting diode chip can be arranged in the at least one cavity, as described further above, while the electrical component is arranged in a further cavity of the carrier, as will be described in further detail further below. By way of example, regions of the electrical component can project beyond the cavity in which the electrical component is arranged.

Particularly preferably, the electrical component is arranged in a manner completely recessed in the at least one cavity. Preferably, no regions of the at least one electrical component project from the cavity in this case. What can advantageously be achieved as a result is that the light emitted by the light-emitting diode chip during the operation of the light-emitting diode device is prevented from being shaded by the electrical component or by parts of the electrical component.

In accordance with a further preferred embodiment, the light-emitting diode device comprises a carrier having at least one cavity, and a light-emitting diode chip arranged on the carrier. Furthermore, the light-emitting diode device comprises an electrical component, which is arranged in a manner completely recessed in the at least one cavity, and an ESD protection element, which is formed by a partial region of the carrier.

In accordance with a further embodiment, the light-emitting diode chip is arranged in the at least one cavity and the electrical component is arranged in a further cavity. In this case, both the light-emitting diode chip and the electrical component can be arranged in a manner partly or completely recessed in the respective cavity. Preferably, the cavity in which the light-emitting diode chip is arranged is arranged in a manner optically separated from the further cavity in which the electrical component is arranged. In this case, the expression "optically separated" can mean, in particular, that light emitted by the light-emitting diode chip cannot impinge directly on the further cavity, that is to say cannot directly irradiate the further cavity, without, for example, being reflected beforehand.

In accordance with one particularly preferred embodiment, the light-emitting diode device comprises a carrier, a light-emitting diode chip and at least one electrical component, wherein the carrier has a cavity and at least one further cavity optically separated therefrom, and wherein the light-emitting diode chip and the at least one electrical component are arranged in each case in a manner completely recessed in a cavity.

The cavity in which the electrical component is arranged can be arranged, for example, in the same surface of the carrier as the cavity in which the light-emitting diode chip is arranged, as a result of which, for example, the light-emitting diode chip and the electrical component can be interconnected with one another by means of short conduction tracks.

In accordance with a further embodiment, the cavity in which the electrical component is arranged is arranged on an opposite side of the carrier relative to the light-emitting diode chip. By way of example, a surface of the main body that is situated opposite that surface of the carrier which is provided with the light-emitting diode chip and which can form the top side of the carrier has a depression that forms the cavity of the electrical component. What can advantageously be achieved as a result is that the light-emitting diode device can be embodied particularly compactly. Furthermore, such an arrangement can prevent the electrical component from partly shielding a light emission of the light-emitting diode chip.

What can be achieved in the case of the light-emitting diode device described here is that the light-emitting diode device has particularly small dimensions, in particular a particularly small structural height, which is becoming ever more important in the design of light-emitting diode devices. Especially in the case of mobile applications, for example, for an integrated LED camera flash in smartphones or digital cameras, light-emitting diode chip and further discrete components are intended to occupy as little space as possible.

In accordance with a further embodiment, the electrical component and a further electrical component are arranged in a manner completely recessed in one or a plurality of cavities. By way of example, at least one further electrical component is arranged in a manner completely recessed in the cavity in which the electrical component is also arranged. In other words, the cavity in which the electrical component is arranged can be embodied such that at least two electrical components can be arranged therein. A particularly compact design of a light-emitting diode device comprising a light-emitting diode chip and at least two electrical components can be achieved as a result.

In accordance with a further embodiment, the electrical component and the further electrical component are arranged in each case in a manner partly or completely recessed in a separate cavity. The cavity in which the further electrical component is arranged can be arranged, for example, on the same side of the carrier on which the light-emitting diode chip is arranged. Alternatively, the cavity in which the further electrical component is arranged can be arranged on the opposite side of the carrier relative to the light-emitting diode chip.

In accordance with a further preferred embodiment, the light-emitting diode device comprises an NTC thermistor component and a PTC thermistor component, which are arranged in a manner completely recessed each in a dedicated cavity or else as a pair in one same cavity. As a result, in the case of such a light-emitting diode device, it is possible to achieve an integration of protection components against overcurrents, for example, in the form of a PTC thermistor component, and temperature sensors, for example, in the form of an NTC thermistor component, together with a particularly small structural height of the light-emitting diode device.

In accordance with a further embodiment, the main body has vias. Via stands for "vertical interconnect access" and denotes a plated-through hole. Preferably, at least one via is embodied as a thermal via, that is to say as a thermally conductive plated-through hole. Furthermore, a plurality or all of the vias can be embodied as thermal vias. The at least one thermal via can advantageously improve the dissipation of heat away from the light-emitting diode chip. Preferably, the at least one thermal via comprises a material having a good thermal conductivity. By way of example, the at least one via can extend from the base surface of the cavity of the light-emitting diode chip to a surface of the carrier that faces away from, in particular is situated opposite, the cavity of the light-emitting diode chip. By way of example, the at least one via comprises or consists of copper, silver or silver-palladium. Furthermore, it can also be possible for at least one via to be provided which serves as an electrical lead between the light-emitting diode chip and an electrical connection area in the form of a metallization arranged on a surface of the carrier that faces away from the cavity of the light-emitting diode chip.

In accordance with a further embodiment, the light-emitting diode chip is at least partly enclosed by a protective coating. By way of example, the light-emitting diode chip is arranged in a cavity covered by the protective coating. The protective coating can serve as a lens of the light-emitting diode device. Furthermore, it is possible for a further cavity and/or an electrical component arranged in the further cavity also to be at least partly covered by the protective coating. The protective coating preferably comprises silicone or consists of silicone.

In accordance with a further embodiment, the carrier has a metallization on a side facing away from the cavity. The metallization can extend over the entire side of the carrier that faces away from the at least one cavity. Alternatively, the metallization can extend over a partial region of the side of the carrier that faces away from the at least one cavity. Preferably, the metallization serves for the electrical connection of the light-emitting diode device, for example, to a substrate or to a printed circuit board. The metallization can thus be arranged on an underside of the carrier, while the cavity and in particular also the light-emitting diode chip are arranged on the opposite top side.

In accordance with a further embodiment, the main body has an insulation layer. The insulation layer is preferably an electrically insulating layer. By way of example, the main body can comprise a varistor material coated with the insulation layer on at least one side. By way of example, an electrical insulation between components arranged on the carrier and the main body or regions of the main body can be achieved by means of the insulation layer. Preferably, the insulation layer comprises one of the following materials or consists of one of the following materials: titanium oxide, aluminum oxide, aluminum nitride, silicon oxide, silicon nitride.

The light-emitting diode device described here is distinguished in particular by a small structural height and good thermal management. Furthermore, what can be achieved in the case of a light-emitting diode device described here is that the emission from the light-emitting diode chip is not adversely influenced by electrical components, such as, for example, discrete ESD protection components or thermal sensors.

BRIEF DESCRIPTION OF THE DRAWINGS

Further advantages and advantageous embodiments of the light-emitting diode device are evident from the embodiments described below in association with FIGS. 1 to 5.

In the figures.

DETAILED DESCRIPTION OF ILLUSTRATIVE EMBODIMENTS

In the exemplary embodiments and figures, identical or identically acting constituent parts may be provided in each case with the same reference signs. The illustrated elements and their size relationships among one another should not be regarded as true to scale, in principle. Rather, individual elements such as, for example, layers, components and regions may be illustrated with exaggerated thickness or size dimensions in order to enable better illustration and/or in order to afford a better understanding.

Figure 1:
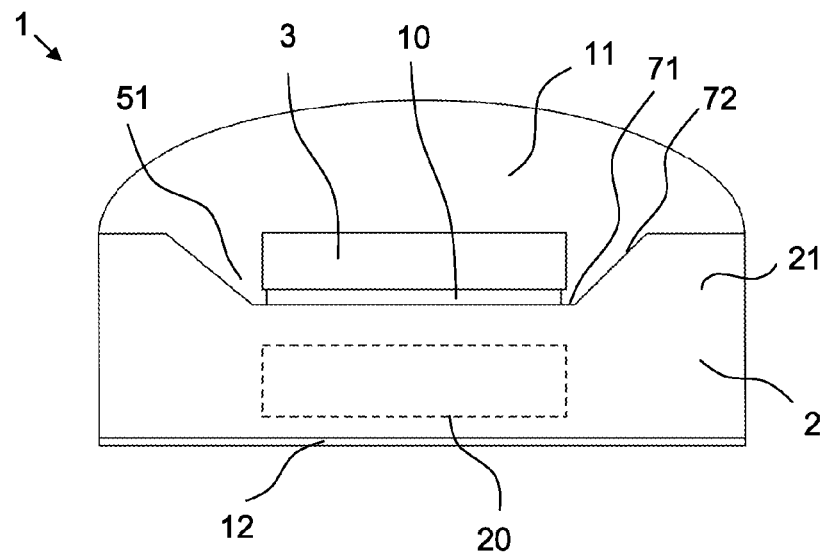
FIG. 1 shows a schematic sectional view of a light-emitting diode device in accordance with one exemplary embodiment.

FIG. 1 shows a schematic sectional view of a light-emitting diode device 1 in accordance with a first exemplary embodiment.

The light-emitting diode device 1 comprises a carrier 2 having a ceramic main body 21 composed of ZnO—Bi. Alternatively, the main body 21 can comprise for example, ZnO—Pr, SrTiO3 or one or more further varistor ceramics. Furthermore, it is possible for the main body 21 to comprise a composite composed of a varistor ceramic and glass or a composite composed of a varistor ceramic and an organic material. The carrier 2 has a cavity 51 in a surface of the carrier 2 and in particular of the main body 21.

The light-emitting diode device 1 furthermore comprises a light-emitting diode chip 3, which is arranged in a manner at least partly recessed in the cavity 51. Advantageously, the light-emitting diode chip 3 is arranged in a manner completely recessed in the cavity 51, as shown in the exemplary embodiment in accordance with FIG. 1.

Furthermore, the light-emitting diode device 1 comprises an ESD protection element 20 which is formed by a partial region of the carrier 2. In this case, as described further below in connection with FIG. 5, the ESD protection element 20 is embodied as a varistor. Alternatively, the ESD protection element 20 can also be embodied as a semiconductor diode integrated into the carrier 2.

What can advantageously be achieved by means of the integration of the ESD protection element 20 into the carrier 2 of the light-emitting diode device 1 is that the light-emitting diode device 1 has particularly small dimensions, since there is no need to provide additional space on the carrier 2 for the ESD protection element 20. Furthermore, it is advantageously possible to avoid a situation in which an ESD protection component arranged on the surface of the carrier shades light generated by the light-emitting diode chip 3.

The cavity 51 formed in the carrier 2 has a base surface 71 and two side surfaces 72 running obliquely at an angle of greater than or equal to 120° and less than or equal to 150° with respect to the base surface 71. The base surface 71 and the side surfaces 72 are provided with a reflective layer (not shown). By means of the reflective layer, a luminous efficiency of light emitted by the light-emitting diode chip 3 can be improved by virtue of the fact that a large portion of light which is emitted by the light-emitting diode chip 3 and impinges on the surfaces coated with the reflective light is reflected and not absorbed.

The light-emitting diode chip 3 has contact areas which serve for making contact with and/or mounting the light-emitting diode chip 3 and of which one contact area 10 is shown purely by way of example, with which the light-emitting diode chip 3 is fixed on the base surface 71 of the cavity 51. The light-emitting diode chip is preferably soldered onto the base surface 71. The contact area 10 comprises a gold-tin alloy. Alternatively, the contact area 10 can comprise copper, nickel or gold or an alloy or layer sequence composed of at least two of these materials.

On that side of the carrier 2 which faces away from the cavity 51, a metallization 12 is applied on the main body 21. The metallization 12 serves for the electrical connection of the light-emitting diode device 1. The carrier 2, and in particular the main body 21, furthermore also has plated-through holes and/or conductor tracks for interconnecting the elements shown, these not being shown for the sake of clarity.

Furthermore, the light-emitting diode chip 3 and the electrical component 41 are enclosed by a protective coating 11. The protective coating 11 comprises silicone and acts as a lens. Furthermore, the protective coating 11 can be embodied as a wavelength conversion layer. As an alternative to the exemplary embodiment shown, the light-emitting diode device can also have no protective coating 11 or be provided with a protective coating only partly, for example, above the light-emitting diode chip 3.

The further figures show exemplary embodiments which are modifications and variants of the exemplary embodiment shown in FIG. 1 and which are therefore explained primarily with regard to the differences relative thereto.

Figure 2:
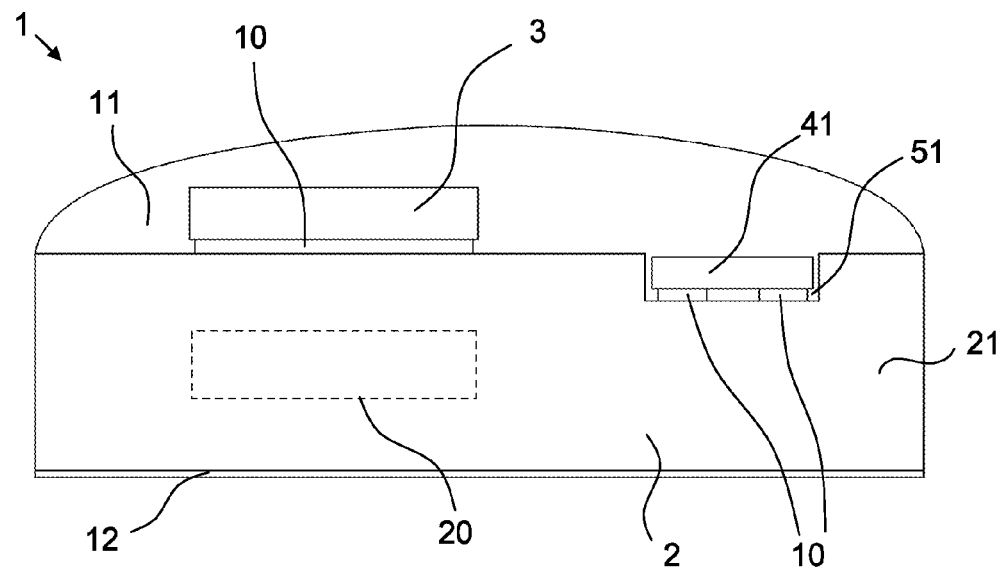
FIGS. 2 to 4 show schematic sectional views of light-emitting diode devices in accordance with further exemplary embodiments.

FIG. 2 shows a schematic sectional view of a light-emitting diode device 1 in accordance with a further exemplary embodiment. In contrast to the exemplary embodiment shown in FIG. 1, the light-emitting diode chip 3 is arranged on a surface of the carrier 2, without being recessed in a cavity.

Furthermore, the light-emitting diode device 1 comprises an electrical component 41, which is embodied as an NTC thermistor component in the exemplary embodiment shown. Alternatively, the electrical component 41 can also be embodied as a PTC thermistor component. The electrical component 41 is arranged in a manner completely recessed in the cavity 51. The recessing of the electrical component 41 in the cavity 51 can thus advantageously prevent light emitted by the light-emitting diode chip 3 from impinging directly on the electrical component 41, which would lead to a shading by the electrical component 41.

The electrical component 41 has two contact areas 10 with which it is fixed on a base surface of the cavity 51. Alternatively, the electrical component 41 can also have more contact areas 10. The contact areas 10 serve for making electrical contact with and mounting the electrical component 41. The contact areas 10 comprise an alloy or layer sequence composed of Cu/Ni/Au. Alternatively, the contact areas 10 can comprise an alloy or layer sequence composed of Cr/Ni/Au or composed of Cr/Cu/Ni/Au.

Figure 3:
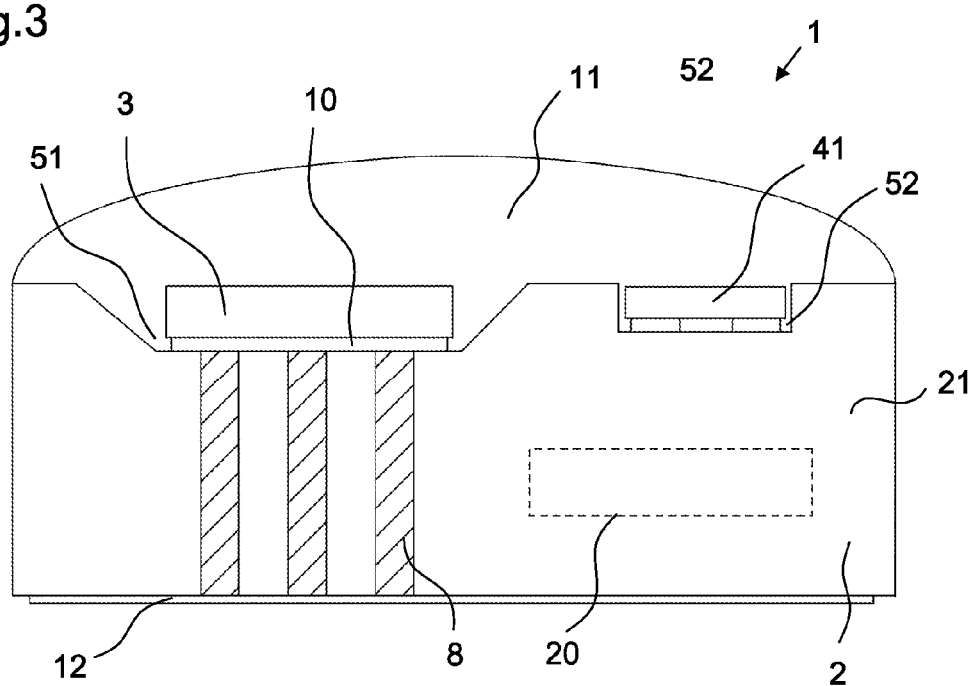

FIG. 3 shows a light-emitting diode device 1 in accordance with a further exemplary embodiment. In contrast to the exemplary embodiment shown in FIG. 1, the light-emitting diode device 1 comprises a further cavity 52, in which an electrical component 41 is arranged in a completely recessed manner. In the exemplary embodiment shown, the electrical component 41 is once again embodied as an NTC thermistor component. Alternatively, the electrical component 41 can also be embodied as a PCT thermistor component.

Furthermore, the main body 21 has vias 8 embodied as thermal vias. The vias 8 are electrically conductively insulated from the contact area 10 of the light-emitting diode chip 3 and serve for the heat dissipation of heat generated by the light-emitting diode chip 3 during operation. The vias 8 comprise copper for this purpose in the exemplary embodiment shown. Alternatively, the vias 8 can also comprise other materials having a high thermal conductivity, such as silver or silver-palladium, for example. The vias 8 run approximately perpendicularly to a surface of the main body 21. Furthermore, one or a plurality of vias, preferably at least two vias, can be embodied as electrical vias which are electrically conductively connected to contact areas 10 of the light-emitting diode chip 3 and serve for making electrical contact with the light-emitting diode chip 3.

Figure 4:
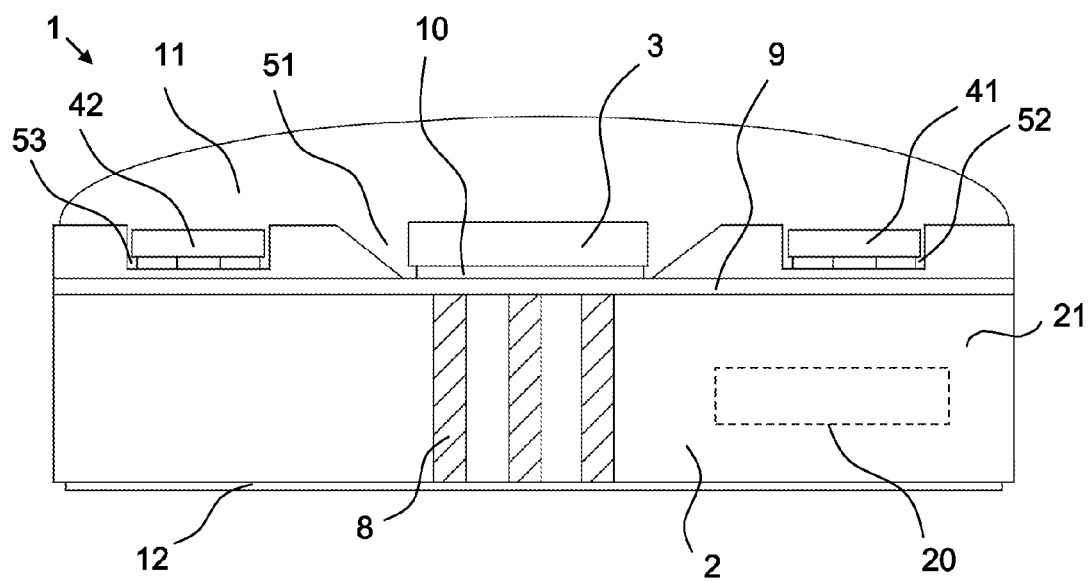

FIG. 4 shows a light-emitting diode device 1 in accordance with a further exemplary embodiment. In contrast to the exemplary embodiment shown in FIG. 3, the carrier 2 has a second further cavity 53, in which a further electrical component 42 is arranged in a completely recessed manner. The light-emitting diode device 1 thus comprises two electrical components 41, 42 arranged in different cavities 52, 53. Preferably, one of the two electrical components 41, 42 is embodied as an NTC thermistor component, and the other as a PTC thermistor component, wherein the NTC thermistor component acts as a thermal sensor and the PTC thermistor component acts as an overcurrent protection element. Alternatively, it is also possible for the electrical component and the further electrical component to be arranged in a manner completely recessed in one cavity. Such an arrangement makes it possible to obtain a particularly compact design of a light-emitting diode device 1 comprising a light-emitting diode chip 3 and two electrical components 41, 42.

Furthermore, the carrier 2 of the light-emitting diode device 1 comprises a main body 21 composed of an organic material or consists thereof. As an alternative thereto, the main body 21 can also comprise aluminum oxide or aluminum nitride or consist of aluminum oxide or aluminum nitride.

The carrier 2 furthermore has an insulation layer 9 that acts as an electrically insulating passivation layer. The insulation layer 9 comprises silicon oxide. Alternatively, the insulation layer can also comprise silicon nitride, aluminum oxide, aluminum nitride, titanium oxide or an LTCC ceramic.

By means of the insulation layer 9, the top side of the carrier 2, said top side carrying the light-emitting diode chip 3, can be electrically insulated from the opposite underside. In this case, the thickness of the insulation layer 9 is preferably chosen in such a way that the best possible thermal conductivity is maintained. In other words, the insulation layer should be as thin as possible with regard to the thermal conductivity and should have a sufficient minimum thickness with regard to the electrical insulation.

Figure 5:
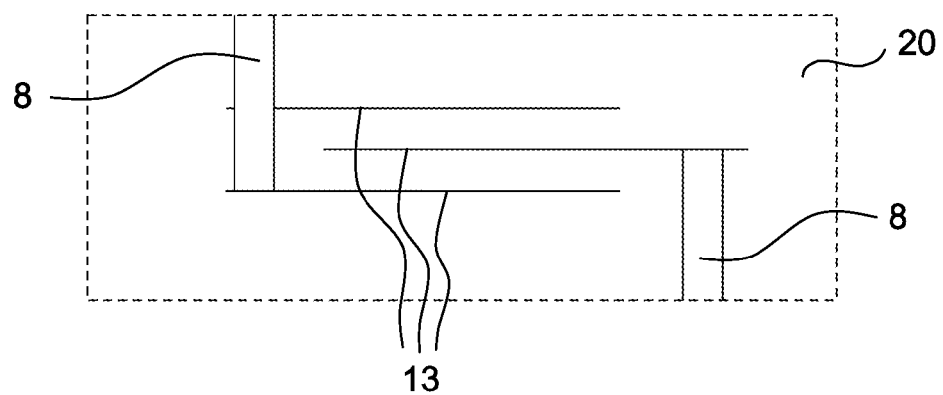
FIG. 5 shows a schematic illustration of an ESD protection element in accordance with one exemplary embodiment.

FIG. 5 shows a schematic illustration of an ESD protection element 20 in accordance with one exemplary embodiment. The ESD protection element 20 comprises a ceramic varistor material composed of ZnO—Pr and has a plurality of overlapping electrodes 13 with which electrical contact is made by means of vias 8. Alternatively, the varistor material can comprise ZnO—Bi or SrTiO3. Furthermore, it is possible for the ESD protection element 20 to comprise a composite composed of ZnO—Pr and glass or a composite composed of ZnO—Pr and an organic material. The ESD protection element 20 shown in FIG. 5 is preferably integrated in a carrier 2 of a light-emitting diode device 1 such as is illustrated in FIGS. 1 to 4. By way of example, the ESD protection element 20 can be buried in the carrier 2 or in the main body 21. A compact design of a light-emitting diode device 1 having ESD protection can be obtained as a result.

The features described in the exemplary embodiments shown can also be combined with one another in accordance with further exemplary embodiments, even if such combinations are not shown explicitly in the figures. Furthermore, the light-emitting diode devices shown can comprise further or alternative features in accordance with the embodiments described above in the general part.

The invention is not restricted to the exemplary embodiments by the description on the basis of said exemplary embodiments, but rather encompasses any novel feature and also any combination of features. This includes in particular any combination of features in the patent claims, even if this feature or this combination itself is not explicitly specified in the patent claims or exemplary embodiments.

The invention claimed is:

1. A light-emitting diode device, comprising:
   a carrier having a cavity;
   a light-emitting diode chip arranged at least partly recessed in the cavity;
   an ESD protection element formed by a region of the carrier;
   an electrical component that is embodied as an NTC thermistor component; and
   a further electrical component that is embodied as a PTC thermistor component, wherein the electrical component and the further electrical component are arranged in a manner completely recessed in one or in a plurality of cavities.

2. The light-emitting diode device according to claim 1, wherein the light-emitting diode chip is completely recessed in the cavity.

3. The light-emitting diode device according to claim 1, wherein the ESD protection element comprises a composite comprising a varistor material and a metal.

4. The light-emitting diode device according to claim 1, wherein the ESD protection element is formed by a semiconductor diode integrated into the carrier.

5. The light-emitting diode device according to claim 1, wherein the carrier comprises a main body, and wherein the main body comprises a composite composed of ZnO—Pr and glass or a composite composed of ZnO—Pr and an organic material.

6. A light-emitting diode device, comprising:
a carrier having a cavity;
a light-emitting diode chip arranged on the carrier;
an electrical component arranged completely recessed in the cavity that comprises an NTC thermistor component;
an ESD protection element formed by a region of the carrier; and
a second electrical component that component comprises a PTC thermistor component, wherein the electrical component and the second electrical component are completely recessed in one or more cavities.

7. The light-emitting diode device according to claim 6, wherein the ESD protection element comprises a composite composed of a varistor material and a metal.

8. The light-emitting diode device according to claim 6, wherein the ESD protection element is formed by a semiconductor diode integrated into the carrier.

9. A light-emitting diode device, comprising:
a carrier having a main body and a plurality of cavities, wherein the main body comprises $SrTiO_3$, ZnO—Pr or ZnO—Bi;
a light-emitting diode chip arranged at least partly recessed in a first cavity of the plurality of cavities;
a first electrical component formed in a second cavity of the plurality of cavities;
a second electrical component formed in a third cavity of the plurality of cavities, the light-emitting diode chip positioned between the first electrical component and the second electrical component; and
an ESD protection element formed by a region of the carrier.

10. The light-emitting diode device according to claim 9, wherein the ESD protection element comprises a composite comprising a varistor material and a metal.

11. The light-emitting diode device according to claim 9, wherein the ESD protection element is formed by a semiconductor diode integrated into the carrier.

12. A light-emitting diode device, comprising:
a carrier having a main body and a plurality of cavities, wherein the main body comprises aluminum oxide or aluminum nitride;
a light-emitting diode chip arranged at least partly recessed in a first cavity of the plurality of cavities;
a first electrical component formed in a second cavity of the plurality of cavities;
a second electrical component formed in a third cavity of the plurality of cavities, the light-emitting diode chip positioned between the first electrical component and the second electrical component; and
an ESD protection element formed by a region of the carrier.

13. The light-emitting diode device according to claim 12, wherein the ESD protection element comprises a composite comprising a varistor material and a metal.

14. The light-emitting diode device according to claim 12, wherein the ESD protection element is formed by a semiconductor diode integrated into the carrier.

* * * * *